United States Patent [19]

Stickney et al.

[11] Patent Number: 4,754,101

[45] Date of Patent: Jun. 28, 1988

[54] ELECTROMAGNETIC SHIELD FOR PRINTED CIRCUIT BOARD

[75] Inventors: William H Stickney, Delaware Water Gap; Ronald W. Brewer, Bushhill, both of Pa.

[73] Assignee: Instrument Specialties Co., Inc., Delaware Water Gap, Pa.

[21] Appl. No.: 922,409

[22] Filed: Oct. 23, 1986

[51] Int. Cl.[4] .............................................. H25K 9/00
[52] U.S. Cl. .................................. 174/35 R; 361/424
[58] Field of Search ..................... 174/35 R, 35 MS; 361/424; 220/22

[56] References Cited

U.S. PATENT DOCUMENTS

| | | | |
|---|---|---|---|
| 2,125,856 | 8/1938 | De Witt | 220/22 |
| 2,257,536 | 9/1941 | Roycroft | 220/22 X |
| 3,721,746 | 3/1973 | Knappenberger | 174/35 MS |
| 4,330,163 | 5/1982 | Aikens et al. | 439/71 |
| 4,370,515 | 1/1983 | Donaldson | 174/35 R |
| 4,390,220 | 6/1983 | Benasutti | 439/71 |
| 4,404,617 | 9/1983 | Ohyama et al. | 361/424 |
| 4,433,886 | 2/1984 | Cassarly et al. | 439/65 |
| 4,437,718 | 3/1984 | Selinko | 439/591 |
| 4,512,618 | 4/1985 | Kumar | 439/95 |
| 4,514,029 | 4/1985 | Lax et al. | 439/610 |
| 4,556,757 | 12/1985 | Oberbach | 174/35 R |

*Primary Examiner*—A. T. Grimley
*Assistant Examiner*—David A. Tone
*Attorney, Agent, or Firm*—Burns, Doane, Swecker & Mathis

[57] ABSTRACT

An electromagnetic shield includes electrically conductive walls arranged to form a closed boundry. The walls include pins projecting from a lower edge to secure the shield on a printed circuit board and to provide a connection to a conducting layer in the printed circuit board and engagement prongs on the upper edge to engage a cover plate.

29 Claims, 2 Drawing Sheets

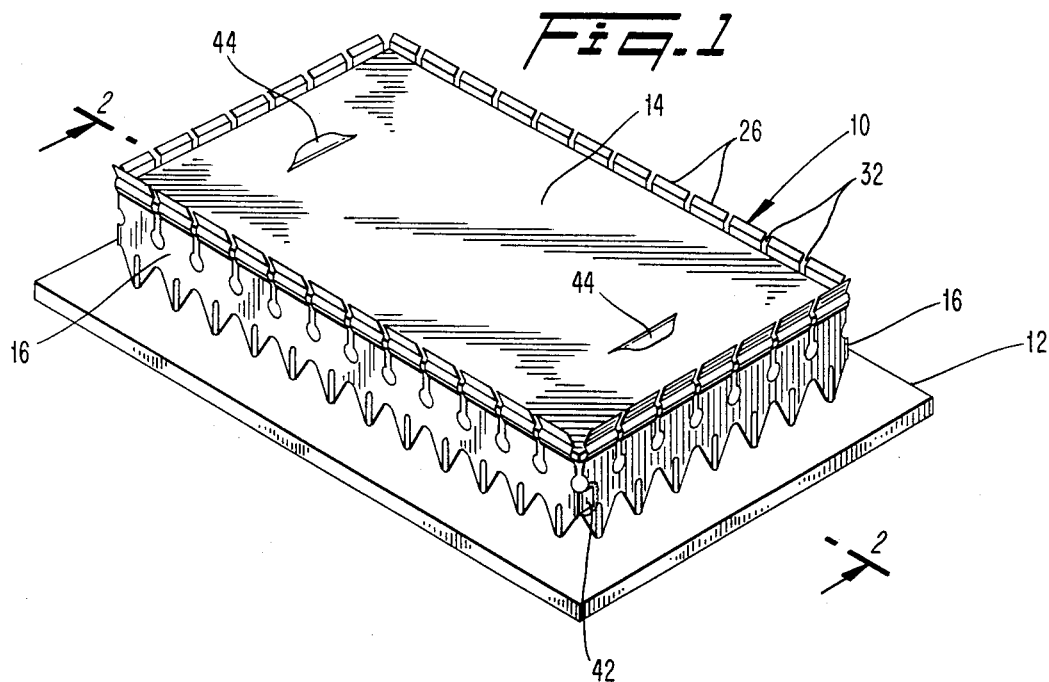
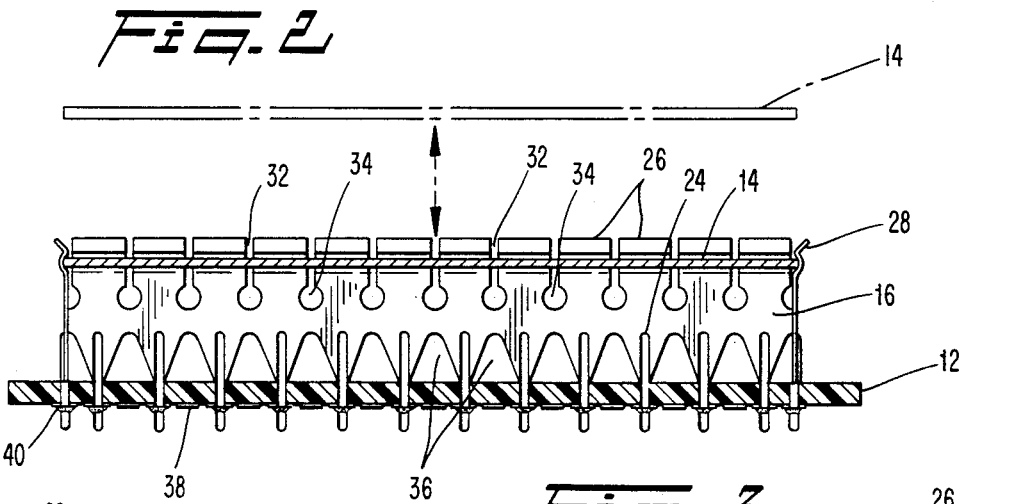
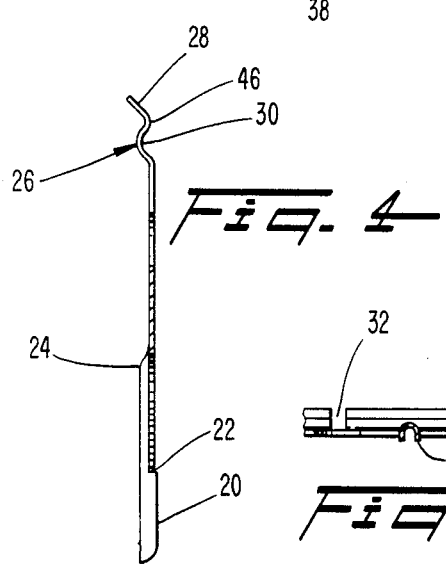
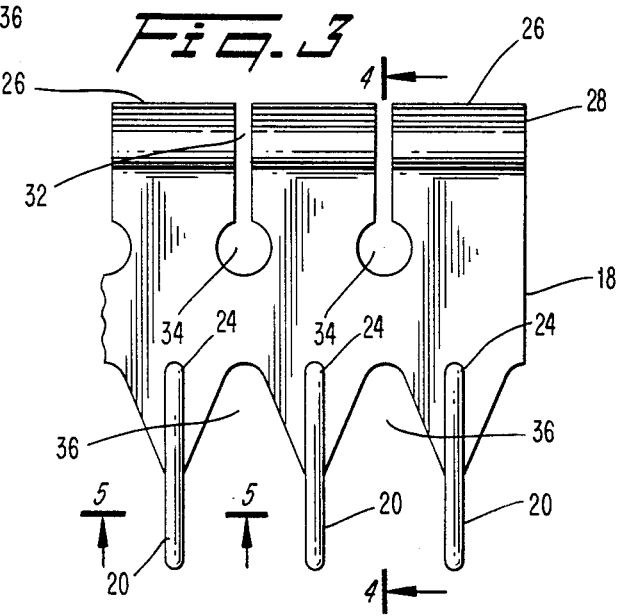

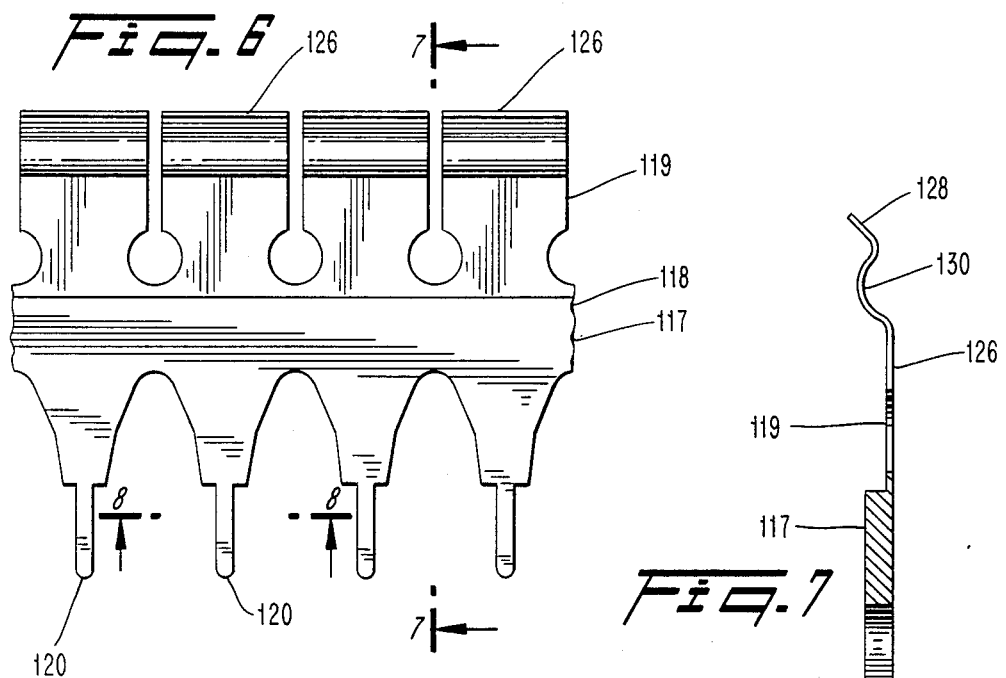
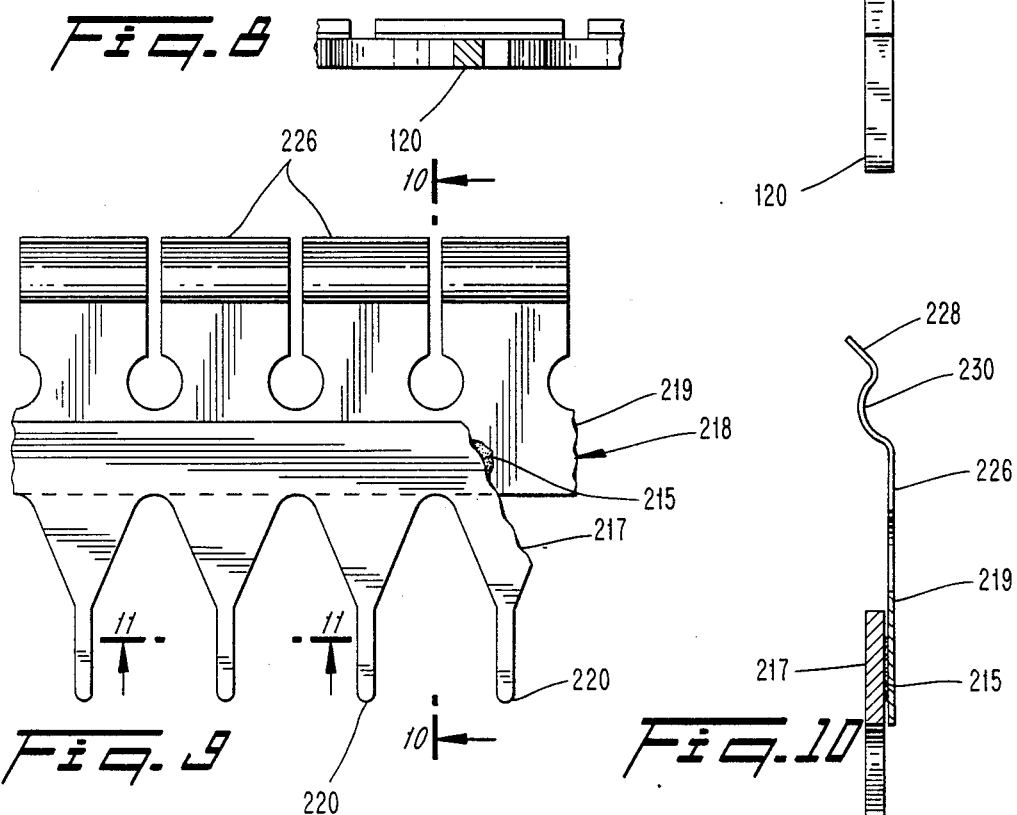
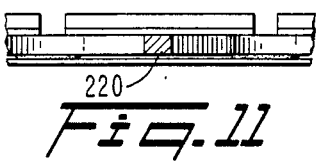

ELECTROMAGNETIC SHIELD FOR PRINTED CIRCUIT BOARD

BACKGROUND AND SUMMARY OF THE PRESENT INVENTION

The present invention relates generally to shielding devices for minimizing electromagnetic interference and susceptibility effects on electrical and electronic devices, and more particularly, to a shielding device that is easily formed to a desired size and shape, and to a method of assembly of the shielding device.

It is highly desirable to provide shielding for electronic components found in radio transmitters, radio receivers, computers and other electronic devices that use circuitry that emits or is susceptible to electromagnetic radiation. It is known that these components can be shielded to reduce undesirable electromagnetic interference and/or susceptibility effects with the use of a conductive shield that reflects or dissipates the electromagnetic charges and fields. Such shielding is generally grounded to allow the offending electrical charges and fields to be dissipated without disrupting the operation of the electronic components enclosed within the shield.

A variety of devices have been utilized for shielding electronic components, but these prior art devices have not been entirely satisfactory since they are generally not adjustable in size or in shape since they usually come pre-assembled in predetermined sizes and shapes.

A variety of known prior art shielding devices for components provided on printed circuit boards are frequently included within the same frame or packaging that supports the component being shielded. In order to minimize the size of the component package, the shields are sometimes arranged close to the components being shielded. This close arrangement impedes effective ventilation of these components.

For example, a known shielding device is disclosed in U.S. Pat. No. 4,433,886 issued on Feb. 28, 1984 to Cassarly et al. The Cassarly et al. patent discloses a connector mounting for integrated circuit chip packages that includes a rectangularly shaped electromagnetic shield that is made from electrically conductive sheet metal. The shield has four uninterrupted side walls, from which extend a plurality of rigid ground contact pins. The shield also includes a snap-on cover member having a saddle-like frame that is hingedly mounted at one end to the connector mounting. The disclosed shield is preformed in specific shapes and sizes, and does not offer an end user the ability to adjust the shape or size of the shield.

Another known protective shield is disclosed in U.S. Pat. No. 4,437,718 issued on Mar. 20, 1984 to Selinko. The Selinko patent discloses a non-hermetically sealed stackable chip carrier package having a metallic protective shield. The shield comprises a flat plate having four legs which extend downwardly to support the plate. The shield is intended to be used within the chip package and is not particularly adaptable to a variety of situations.

Another shielding device is disclosed in U.S. Pat. No. 4,512,618 issued Apr. 23, 1985 to Kumar. The Kumar patent discloses an electromagnetic shield including a pre-formed metal member having a shroud whose shape specifically conforms to a connector that it is intended to shield.

Such prior art shielding devices are generally manufactured in only one or a few different specific sizes that cannot be altered easily by the user. Therefore, if a wide variety of differently sized shields are desired, suppliers and users must maintain in stock a relatively large supply of such electromagnetic shields in many different shapes and sizes.

Accordingly, it is an object of the present invention to provide an electromagnetic shield for a printed circuit board that is easy to store and can be easily made to a desired size and shape. It is therefore, a primary object of this invention to fulfill that need by providing such a shield.

More particularly, it is an object of the present invention to provide an electromagnetic shield that can be stored in a disassembled mode and easily assembled by an end user.

It is another object of the present invention to provide an electromagnetic shield that can be easily assembled into one of a variety of shapes and sizes by an end user.

Yet another object of the present invention is to provide an electromagnetic shield that allows ventilation of the components being shielded.

Still another object of the present invention is to provide an electromagnetic shield having a removable cover and engagement prongs to hold the cover that are designed to maintain uniform contact with the cover.

Still yet another object of the present invention is to provide an electromagnetic shield having a top cover that is easily removable to provide access to the components being shielded therein.

It is yet another object of the present invention to provide an electromagnetic shield that is light-weight, yet structurally stable.

A further object of the present invention is to provide an electromagnetic shield, the walls of which are made from a single strip of material, the dimensions of which can be easily adjusted by an end user.

These and other objects are accomplished by an electromagnetic shielding device in accordance with the present invention. The shielding device includes an electromagnetic shield that is assembled from two primary components.

The walls of the shield are made from a longitudinally extending strip of electrically conductive metal having longitudinally extending parallel edges and first and second ends. A plurality of pins extends substantially perpendicularly from one edge thereof and a plurality of engagement prongs extends from the other edge thereof. The engagement prongs are adapted to retain a metal cover plate on the shield.

BRIEF DESCRIPTION OF THE DRAWINGS

Preferred embodiments of the present invention will be described in greater detail with reference to the accompanying drawings, wherein like members bear like reference numerals and wherein:

FIG. 1 is a perspective view of a first preferred embodiment of the electromagnetic shield according to the present invention;

FIG. 2 is a view along the line 2—2 of FIG. 1;

FIG. 3 is a side view of a wall section of the first preferred embodiment;

FIG. 4 is a view along the line 4—4 of FIG. 3;

FIG. 5 is a view along the line 5—5 of FIG. 3;

FIG. 6 is a side view of a wall section of the electromagnetic shield according to a second preferred embodiment of the present invention;

FIG. 7 is an enlarged view along the line 7—7 of FIG. 6;

FIG. 8 is an enlarged view along the line 8—8 of FIG. 6;

FIG. 9 is a side view of a wall section of the electromagnetic shield according to a third preferred embodiment of the present invention;

FIG. 10 is an enlarged view along the line 10—10 of FIG. 9; and

FIG. 11 is an enlarged view along the line 11—11 of FIG. 9.

DETAILED DESCRIPTION OF THE PREFERRED EMBODIMENTS

With reference to FIG. 1, a first preferred embodiment of an electromagnetic shield 10 according to the present invention is arranged on a printed circuit board 12 having uniform rows of perforations forming a closed figure. The electromagnetic shield 10 is designed to encompass and shield one or more electronic components (not shown) that are mounted on the printed circuit board 12. The electromagnetic shield 10 can be used to shield either a section of a printed circuit board or the entire board.

The shield 10 according to the first preferred embodiment includes a cover plate 14 and walls 16. With reference to FIG. 3, the walls 16 are made from a single length or strip 18 of metallic material. In the first preferred embodiment the strip is stamped from 0.005″ thick beryllium copper. However, other methods of forming may be used, and other materials including other metals and other alloys of copper may be used. In particular, however, it is desirable to use a material having a sufficient resiliency so as to provide a desired level of flexibility in the walls of the shield as discussed herein. Moreover, it is desirable that the material be metals that are capable of being readily soldered or welded and be capable of low resistance electrical conductivity. However, if the primary purpose of the shield is to reduce magnetic field interference, it may be preferable to use a steel or other alloy which has a relatively high permeability at low frequencies. To provide electrical conductivity on materials with relatively high resistance, the material may be plated with a low resistance metal, such as tin. If the principal concern is to reduce electrical field interference, then it may be preferable to use a copper alloy as will be readily apparent to one skilled in the art of electromagnetic shielding upon reading the present specification.

If desired, the walls 16 could be formed into any reasonable configuration. However, in the preferred embodiment, the walls 16 are formed into a square or rectangle. By using the walls 16 in the form of a rectangle, the configuration of the cover plate 14 is simplified along with a simplification of mounting the walls 16 on a conventional printed circuit board 12.

With reference to FIGS. 3 and 4, the strip material 18 has a plurality of pins 20 projecting from one edge thereof. Preferably the pins 20 extend about 0.125″ from the edge of the strip material 18. The pins 20 are preferably equally spaced for alignment with the holes in the printed circuit board 12 which are typically spaced 0.20″ apart. In this first preferred embodiment, the pins 20 have a three dimensional shape for additional stability. With reference to FIG. 5, the pins 20 are U-shaped in cross section, with a radius of about 0.010″.

Small notches 22, preferably about 0.007″ wide and 0.005″ deep, may be formed in the pins 20 at the regions where the pins 20 join the strip material 18. With reference to FIG. 4, the notches 22 facilitate the bending of the pins 20 into a U-shaped cross section by separating the portions of the pins 20 that extend beyond the plane of the strip material 18 from the strip material 18.

To provide additional stability to the strip material 18, the embossment having a U-shaped cross section extends into regions 24 of the strip 18 that are adjacent to and in alignment with the pins 20. Each region 24 is preferably about 0.15″ in length and appears as an extension of a pin 20. The effect of the regions 24 is to reduce the deflection of the walls 16 when the cover plate 14 is being attached to or removed from the shield 10.

With further reference to FIGS. 3 and 4, the strip material 18 has a plurality of engagement prongs 26 projecting from an edge opposite the edge from which the pins 20 project. The edge from which the engagement prongs 26 project is substantially parallel to the edge from which the pins 20 project. The regions 24 provide enough stiffness to support the prongs 26 without relying on adjoining sections of the walls 16 or corners. The prongs 26 each have a flanged end 28, preferably about 0.030″ in length, to allow for easy insertion of the cover plate 14, and an outward curvature forming a recess 30 to receive and hold the cover plate 14. In the first preferred embodiment, the recess 30 has a radius of about 0.025″.

The engagement prongs 26 are defined by uniformly spaced slots 32 formed along the edge of the strip material 18, the slots 32 extending perpendicular to the longitudinal direction of the strip material 18. Each slot 32 is preferably 0.030″ wide, 0.215″ in length, and 0.200″ apart on centers. The spacing, width, and length of the slots 32 determine the dimensions of the prongs 26, which affects the deflectability of the prongs 26. Furthermore, the slots 32 allow the prongs 26 to work independently of each other to provide individual and continuous contact with the cover plate 14, even if the cover plate 14 is irregular or out of square. The slots 32 also provide ventilation to the shield 10.

Circular openings 34 are provided at the lower end of each of the slots 32. These openings 34 are preferably 0.078″ in diameter. They serve to reduce the width of the prongs 26 at their base, and thus increase the deflectability of the prongs 26. The openings 34 also provide ventilation to the components encased within the shield 10. The importance of the relative deflectability of the various parts of the shield 10 will be discussed below.

As a result of the openings 34, the base width of the prongs 26 in the first preferred embodiment is about 0.122″, while the width of the prongs 26 at their flanged end is about 0.170″. Preferably, the length of the prongs 26 is 0.215″, as measured from the center of the openings 34 to the flanged end 28 of the prongs 26.

Additional openings 36, somewhat triangular in shape and preferably 0.15″ in height and base width, are provided along the strip 18 for ventilation of the components encased within the shield 10. The openings 36 may be of any reasonable size and shape, provided sufficient conductive material remains for shielding purposes. Additional openings (not shown) may be provided along the strip material 18 if additional ventilation is needed, such as for use with high power components.

The additional openings 36 can accommodate circuit board tracks or filtering components such as ferrites, feed-through capacitors, or chokes.

With reference to FIG. 2, the pins 20 of the strip material 18 are mounted through the holes of the printed circuit board 12. The pins 20 are connected to a metallic layer 38 within or on the under side of the board 12 with solder 40 or an equivalent means. This layer 38 and/or the pins 20 are grounded in a conventional manner.

The bottom of the shielded enclosure will usually consist of conductive material included on the circuit board 12. Such material will usually be a section of the copper foil normally found on circuit boards. The foil can be on either side of the board, or can be a center layer, or a combination of layers. The board may be plated with a high permeability material, such as nickel, to improve absorption losses. A fabricated plate or cover may be mounted to the board to form the bottom of the enclosure.

It is preferable, when forming the shield 10 with the strip material 18, that the end of the strip and beginning of the strip occur at a corner of the structure being formed. For structural stability, and to promote grounding, the free ends may be joined together by soldering, spot welding, or with fasteners. However the shield may be constructed of individual walls which are not connected at the corners to one another. If the corners are to be connected to one another one type of fastener may be formed when cutting the strip 18 to the desired length by leaving a tab 42 extending from one end of the strip 18. Alternatively, the tab 42 may be preformed at the initial end of the strip material 18. After the strip 18 is arranged into a desired configuration, the tab 42 may be folded over the other end of the strip 18 and soldered or spot welded thereto in order to achieve an electrical connection and additional structural support. Other known conventional mechanical fasteners can also be used, instead of or in addition to the tab 42, to join the ends of the strip 18 or to reinforce the corners of the shield 10.

It is also possible that each of the walls 16 can be made from a separate strip of material, with each of the corners being fastened together, if desired.

Once the walls 16 are arranged into their desired shape and placed on the printed circuit board 12, the cover plate 14, having dimensions similar to those of the configuration formed by the walls 16, is then inserted into the recesses 30 of the prongs 26.

The cover plate 14 is preferably made from metal, plated plastic, or composite materials, and it is preferable that it be electrically conductive. The cover plate 14 may be 0.010" thick, however, the particular composition and thickness of the cover plate 14 may vary according to a particular application.

Although the cover plate 18 is preferably flat, it is possible that the cover plate 14 could be formed with a raised portion in order to accommodate a large component within the shield 10. It is also possible that the plate could have a vertically extending rim that would engage with specially designed engagement prongs (not shown).

If necessary for ventilation, air vents 44, such as eyelid style thumb holes, may be formed in the cover plate 14. These vents 44 can additionally serve as thumb nail grips for removing or replacing the cover plate 14. The cover plate 14 may include, instead of or in addition to the vents 44, louvers or perforations for ventilation, heat sink components, handles, or other hardware to suit a specific need or function. In addition, material to absorb electrical energy, such as a microwave absorber, may be attached or bonded to the inside of the cover plate 14. Ferrite may be used as a microwave absorber.

With reference to FIG. 2, the cover plate 14 may be mounted onto the device 10 or removed from the device 10 with a substantially vertical motion of the cover plate 14. In the process of inserting the cover plate 14 into or removing it from the recesses 30 of the prongs 26, the prongs 26 are deflected outward to allow the cover plate 14 to pass over ridges 46 that are formed between the flanged end 28 and the recesses 30 of the prongs 26. The spring action of the prongs 26 is adequate to maintain the cover plate 14 in place without any additional hardware, and allows the cover plate 14 to be inserted and removed without any tools.

It is preferable that the shield 10 be designed such that a significant amount of the deflection necessary for the insertion or removal of the cover plate 14 occurs in the prongs 26. Deflection of the pins 20 and the portion of the strip 18 below the prongs 26 should be minimized in order to avoid deforming the walls 16. Such a deformation of the walls 16 may impede electrical contact and/or physical engagement between the prongs 26 and the cover plate 14.

Specifically, it is preferable if at least about 75% and preferably about 80% or more of the deflection occurs in the prongs 26 and the balance occurs below the prongs 26. However, embodiments having less than about 75% of the deflection occurring in the prongs 26 may also be acceptable. However, it would not be desirable to have only a small percentage of the deformation occur in the prongs 26, because that would reduce the ability of each individual prong 26 to deflect an amount necessary to make individual contact with the cover plate 14. This is particularly true if the cover plate 14 does not conform precisely to the shape of the shield 10, or if the walls 16 are particularly long.

For example, if the cover plate 14 has a small protrusion along one edge thereof, then the prong 26 adjacent the protrusion would be deflected outward to accommodate the protrusion. If the prongs 26 are highly deflectable, as preferred, then the prong 26 alone would be deflected and the adjacent portion of the wall 16 would not be deformed. This would allow the prongs 26 adjacent the deflected prong 26 to maintain good electrical and physical contact with their respective portion of the cover plate 14. It is preferable that the prongs 26 each be sufficiently deflectable so that each prong 26 makes good electrical contact with the cover plate 14.

If, however, the prongs 26 were not desirably deflectable, then it is likely that a portion of the wall 16 would be deflected outward to allow the prong 26 to accommodate the protrusion on the cover plate 14. In that situation, adjacent prongs 26 would be similarly moved outward by the deformation of the wall 16, and such outward movement might impede their adequate contact with their respective portion of the cover plate 14. This is particularly true in the center region of a long wall 16, which tends to be more deflectable because of its distance from the corners.

It should now be appreciated that the openings 34 and the embossed regions 24 improve the shield 10 by increasing the relative flexibility of the prongs 26 and the relative rigidity of the strip 18, respectively which causes a relatively higher percentage of the deflection to occur in the prongs 26 than in the remaining portion of the wall 16.

Throughout the detailed description of the preferred embodiment various dimensions of the preferred embodiments illustrated in the drawings have been provided. These dimensions may be readily varied by one skilled in the art upon reading the present specification in order to provide shields having various desired features and dimensions.

It should also be apparent, that the electromagnetic shield 10 does not always have to be used with a cover plate 14. In some situations, the strip 18 could be used to form open sided enclosures or fences. The strip 18 is free standing when soldered into a printed circuit board.

In one preferred embodiment, the strips 18 are manufactured by stamping the strips 18 out of 0.005" of beryllium copper. The stamped strip 18 sheet is then embossed to form the raised regions 24, the flanged ends 28 and recesses 30 of the prongs 26, and the U-shaped cross-section of the pins 20 in a manner readily apparent to one skilled in the art of metalworking.

The electromagnetic shield 10 of the present invention can be sold as an unassembled package. Such a package would include one or more long strips 18 of wall material and several cover plates 14. Thus, an end user could cut off a desired length of strip material 18, fold it into a desired shape and select or cut out a cover plate 14 of the proper dimensions. The strips 18 of wall material and the cover plates 14 can be stored flat, thus not requiring very much storage space.

With reference to FIGS. 6-8, a second preferred embodiment of the present invention will be described. Elements in the second preferred embodiment corresponding approximately to elements in the first preferred embodiment will be referenced in the drawings with a like numeral increased by 100.

With specific reference to FIGS. 6 and 7, a strip of material 118 has engagement prongs 126 with flanged ends 128 and recesses 130 similar to those of the first preferred embodiment.

With continued reference to FIGS. 6 and 7, the strip 118 has a dual thickness, with the lower half 117 being thicker than the upper half 119. According to the second preferred embodiment, the lower half 117 is six times as thick as the upper half 119. Specifically, the upper half 119 is 0.005" and the thickness of the lower half 119 is 0.030".

In the second preferred embodiment, when using thicker material for the lower half 117 of the strip 118, the pins 120 are not U-shaped in cross section as are the pins 20 of the first preferred embodiment, but are merely formed with a solid cross section. With reference to FIG. 8, the pins 120 are square in cross section. However, alternative shapes may be used.

With reference to FIGS. 9-11, a third preferred embodiment of the present invention will be described. Elements in the third preferred embodiment corresponding approximately to elements in the first preferred embodiment will be referenced in the drawings with a like numeral increased by 200.

With reference to FIGS. 9 and 10, a strip of material 218 has engagement prongs 226 with flanged ends 228 and recesses 230 similar to those of the first embodiment.

With continued reference to FIGS. 9 and 10, the strip 218 is comprised of a lower strip 217 and an upper strip 219, welded together at a region 215. This third preferred embodiment allows the strip 218 to be made from materials of not only different thicknesses, but also of different compositions. For example, the upper strip 219 is preferably made from 0.005" thick beryllium copper, and the lower strip 217 is preferably made from 0.030" thick brass. However, other thicknesses and compositions may be suitable. With reference to FIG. 11, the pins 220 of the third preferred embodiment are preferably solid with a square cross section, similar to those of the second preferred embodiment.

The cover plate 14 used in the second and third preferred embodiments may be similar to that described in conjunction with the first preferred embodiment.

Because of the relative difference in thickness between the lower half 117,217 of the strip 118,218 and the upper half 119,219 of the strip, and because the prongs 126,226 are made from the thinner upper half 119,219, the second and third preferred embodiments have a favorable prong/strip stiffness ratio. In other words, a desirable percentage of the deflection occurs in the prongs 126,226.

The principles, preferred embodiments and modes of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others without departing form the spirit of the present invention.

Accordingly, it is expressly intended that all such variations and changes which fall within the spirit and scope of the present invention as defined in the claims, be embraced thereby.

What is claimed is:

1. An electromagnetic shield, comprising:
   electrically conductive walls arranged to form a closed frame;
   means projecting from a lower edge of the walls for engaging with a printed circuit board;
   deflectable engagement prongs extending from an upper edge of the walls; and
   an electrically conductive cover having dimensions similar to those of the closed frame engaged within said engagement prongs;
   wherein the walls and engagement prongs are outwardly deflectable to allow for insertion and removal of the cover.

2. The electromagnetic shield of claim 1, wherein the engagement prongs have greater deflectability than the walls.

3. The electromagnetic shield of claim 2, wherein the engagement prongs are adapted to incur at least 75% of the deflection necessary for the insertion and removal of the cover occurs in the engagement prongs.

4. The electromagnetic shield of claim 1, wherein the walls have ventilation openings therein.

5. The electromagnetic shield of claim 1, wherein the engaging means comprise regularly spaced pins.

6. The electromagnetic shield of claim 5, wherein the pins have a U-shaped cross section.

7. The electromagnetic shield of claim 1, wherein each of the walls comprises an upper half which includes the upper edge and a lower half which includes the lower edge, said upper half having a thickness less than the thickness of the lower half.

8. The electromagnetic shield of claim 7, wherein the thickness of the lower half is six times the thickness of the upper half.

9. The electromagnetic shield of claim 7, wherein the upper half and the lower half are manufactured from different compositions and are welded together.

10. The electromagnetic shield of claim 9, wherein the upper half is of beryllium copper and the lower half is of brass.

11. The electromagnetic shield of claim 1, wherein the engagement prongs are defined by parallel slots extending in the walls perpendicular to a center line thereof.

12. The electromagnetic shield of claim 1, wherein the walls are made of high permeability material plated with a conductive material.

13. The electromagnetic shield of claim 1, wherein the printed circuit board engaging means include means for grounding the electromagnetic shield to the printed circuit board.

14. A component of an electromagnetic shield, comprising:
a strip of electrically conductive metal;
means projecting from a first edge of the strip for engaging with a printed circuit board, said means projecting substantially perpendicularly to a center line of the strip; and
a plurality of engagement prongs defined by a plurality of slots extending through a second edge of the strip in a direction substantially perpendicular to the center line of the strip;
wherein the engagement prongs each have an outward curve forming a recess for engaging a cover plate.

15. The component of claim 14, wherein said engaging means are regularly spaced pins.

16. The component of claim 15, wherein the pins are adapted to fit in holes of a printed circuit board.

17. The component of claim 15, wherein the pins have a U-shaped cross section.

18. The component of claim 14, further comprising mens extending from one end of the strip for fastening to the other end of the strip.

19. The component of claim 14, wherein the engagement prongs have greater deflectability than the strip.

20. The component of claim 14, wherein the metal is a high permeability material plated with a conductive material.

21. A component of an electromagnetic shield, comprising:
a strip of electrically conductive metal;
means projecting from a first edge of the strip for engaging wiht a printed circuit board, said means projecting substantially perpendicularly to a center line of the strip; and
a plurality of engagement prongs defined by a plurality of slots extending through a second edge of the strip in a direction substantially perpendicular to the center line of the strip;
wherein the metal strip comprises a lower half which includes the first edge and an upper half which includes the second edge, said upper half having a thickness less than the thickness of the lower half.

22. The component of claim 21, wherein the thickness of the lower half is six times the thickness of the upper half.

23. The component of claim 21, wherein the upper half and the lower half are manufactured from different compositions and are welded together.

24. The component of claim 23, wherein the upper half is of beryllium copper and the lower half is of brass.

25. A method of assembling an electromagnetic shield, comprising the steps of:
providing a strip of electrically conductive metal having pins extending from one edge thereof and engagement prongs extending form an opposite edge thereof;
cutting the strip into a preferred length;
forming the strip into a closed frame;
inserting the pins into holes in a printed circuit board; and
engaging a cover within the engagement prongs.

26. The method of claim 25, further comprising the step of fastening together the ends of the strip.

27. The method of claim 25, further comprising the step of grounding at least one of the pins.

28. A component of an electromagnetic shield comprising:
a strip of electrically conductive metal;
means projecting from a first edge of the strip for engaging with a printed circuit board, said means projecting substantially perpendicularly to a center line of the strip;
a plurality of engagement prongs defined by a plurality of slots extending through a second edge of the strip in a direction substantially perpendicular to the center line of the strip, wherein the engagement prongs have greater deflectability than the strip; and
reinforcing means in the strip for reducing the deflectability of the strip.

29. A component of an electromagnetic shield, comprising:
a strip of electrically conductive metal;
means projecting from a first edge of the strip for engaging with a printed circuit board, said means projecting substantially perpendicularly to a center line of the strip;
a plurality of engagement prongs defined by a plurality of slots extending through a second edge of the strip in a direction substantially perpendicular to the center line of the strip; and
aperture means provided at the end of said slots for increasing the deflectability of the engagement prongs, said aperture means having a width greater than the width of said slots.

* * * * *